United States Patent [19]
Yamamoto et al.

[11] Patent Number: 6,124,190
[45] Date of Patent: Sep. 26, 2000

[54] METHOD OF MANUFACTURING SEMICONDUCTOR DEVICE WITH SILICIDE LAYER WITHOUT SHORT CIRCUIT

[75] Inventors: Yoshiaki Yamamoto; Kazuo Aizawa, both of Tokyo, Japan

[73] Assignee: NEC Corporation, Japan

[21] Appl. No.: 08/988,991

[22] Filed: Dec. 11, 1997

[30] Foreign Application Priority Data

Dec. 13, 1996 [JP] Japan .................................. 8-334058

[51] Int. Cl.[7] ................ H01L 21/3205; H01L 21/4763
[52] U.S. Cl. ...................... 438/592; 438/305; 438/683
[58] Field of Search ................................ 438/592, 683, 438/305

[56] References Cited

U.S. PATENT DOCUMENTS 4,855,798  8/1989  Imamura et al. ........................ 357/71

FOREIGN PATENT DOCUMENTS

| | | |
|---|---|---|
| 59-126672 | 7/1984 | Japan . |
| 61-150216 | 7/1986 | Japan . |
| 4-196442 | 7/1992 | Japan . |
| 5-109652 | 4/1993 | Japan . |
| 5-109757 | 4/1993 | Japan . |
| 7-201775 | 8/1995 | Japan . |

*Primary Examiner*—John F. Niebling
*Assistant Examiner*—Alexander G. Ghyka

[57] ABSTRACT

In a method of manufacturing a semiconductor integrated circuit, a gate structure with sidewall insulating films and a field oxidation film are formed on a semiconductor substrate. Then, diffusion layers are formed for the gate structure with the sidewall insulating films. Subsequently, a surface layer is removed from each of the sidewall insulating films and the field oxidation film. Next, a silicide layer is formed in a surface layer of each of the diffusion layers in self-alignment with the gate structure with the sidewall insulating films and the field oxidation film.

18 Claims, 12 Drawing Sheets

METHOD OF MANUFACTURING SEMICONDUCTOR DEVICE WITH SILICIDE LAYER WITHOUT SHORT CIRCUIT

BACKGROUND OF THE INVENTION

1. Field of the Invention

The present invention relates to a method of manufacturing a semiconductor device, and more particularly to a method of forming a silicide layer without a short circuit between a gate electrode and a diffusion layer and between diffusion layers.

2. Description of the Related Art

In recent years, elements in a semiconductor integrated circuit such as an LSI have been formed by a fine processing technique for high integration. For example, an impurity diffusion layer of a source region or a drain region is formed to be shallow in depth and small in area. Further, a wiring pattern for connecting elements is also formed to have a small width. For this reason, the resistance of the impurity diffusion layer and wiring pattern increases preventing high speed operation of the elements. For this reason, a silicide layer of refractory metal, especially, a silicide layer of Ti formed on the surface of an impurity diffusion layer in semiconductor devices have been used to reduce the resistance of the impurity diffusion layer. Thus, high speed operation can be accomplished.

A method is disclosed in U.S. Pat. No. 4,855,798, in which the Ti silicide layer is formed in self-alignment manner. This method of forming the Ti silicide layer in a self-alignment manner will be described with reference to FIGS. 1A to 1G.

First, as shown in FIG. 1A, a field oxide film 2, a gate oxide film 4, a gate electrode 3 and sidewall films 5 are formed on a semiconductor substrate 1. Impurity ions are implanted into exposed portions of the silicon. substrate 1 to form diffusion layers.

Next, as shown in FIG. 1B, a protection oxide film 7 for the impurity ion implantation is formed on the whole surface of the substrate 1 by, for example, a CVD method. Then, impurity ions 8 are implanted to form diffusion layers 9. Subsequently, heat treatment is performed at a temperature equal to or more than 900° C. to activate the implanted impurity ions.

Next, as shown in FIG. 1C, the protection oxide film 7 is removed and a natural oxide film on each of the diffusion layers 9 is removed before the sputtering of Ti.

Next, as shown in FIG. 1D, a Ti film 10 is formed on the whole surface of the substrate 1 by, for example, the sputtering method. The Ti film 10 is heat-treated in an inert gas ambience, e.g., in a nitrogen ambience at a temperature equal to or less than 700° C., to form Ti silicide layers 11 of C49 phase which are $TiSi_2$ having high resistance (first sintering process). At this time, the Ti silicide layers 11 are formed only on the gate electrode 3 and the diffusion layers 9 in a self-alignment manner, as shown in FIG. 1E.

Next, as shown in FIG. 1F, a part of the film 10 of non-reacted Ti is removed from the field oxide film 2 and the sidewall films 5. Then, further heat treatment is performed at a temperature equal to or more than 800° C. As a result, as shown in FIG. 1G, the silicide layers 11 are converted into Ti silicide layers 12 of C54 phase which is $TiSi_2$ having low resistance (second sintering process).

However, in the above-mentioned method, there is a problem in that a short circuit is easily formed between the gate electrode and the source region, and between the diffusion layers, when the finer processing is applied to the elements and then the Ti silicide layer is formed. This short circuit is formed due to the extension of the Ti silicide layer or generation of conductive material onto the region where the Ti silicide layer should not be originally formed. In other words, since the Ti silicide layer is formed on the field oxide film for separating between the diffusion layers and the sidewall film for separating the gate electrode and the diffusion layer, the short circuit is formed between them.

When the etching time of the non-reacted Ti film is elongated to remove the extension of the Ti silicide layer on the field oxidation film or the sidewall film or the conductive material, the Ti silicide layer is also etched. As a result, a new problem occurs in which the resistance of the diffusion layer increases.

Therefore, methods are proposed to prevent the extension of the Ti silicide layer onto the region where the Ti silicide layer should be not formed.

The first conventional example of these methods is described in Japanese Laid Open Patent Disclosure (JP-A-Showa 61-150216). In this method, after a Ti film is formed on a silicon substrate, a first silicide reaction is performed at a relative low temperature of 400 to 600° C. Then, a non-reactive portion of the Ti film is removed and the Ti silicide layers of high resistance are formed on the diffusion layers and a gate electrode. Subsequently, a second sintering process is performed at a temperature of equal to or higher than 800° C. to convert the Ti silicide layer of high resistance into the Ti silicide layer of low resistance. Because the temperature in the first sintering process is low, the extension of the Ti silicide layer can be prevented.

Also, a second conventional example of the above methods is described in Japanese Laid Open Patent Disclosure (JP-A-Showa 59-126672). The second convention example is shown in FIG. 2. In this method, for the purpose of preventing the extension of a Ti silicide layer on a sidewall film or the reaction of the sidewall film and the Ti film, the sidewall film is formed of a SiN film, making it difficult to cause a reaction with the Ti film.

In the methods described above, however, the following new problem is caused. That is, in the method shown in the first conventional example, there is the problem in that a desired resistance cannot be accomplished when finer processing is applied to the diffusion layer or the gate electrode. This is because the layer resistance of the diffusion layer after the second sintering process cannot be set below the desired resistance value, since the temperature of the first sintering process is low so that the resistance of the Ti silicide layer is high.

When the temperature of the second sintering process is raised to create a diffusion layer resistance below the desired resistance value, there is a problem in that Ti elements of the silicide layer cohere. For this reason, when the temperature of the first sintering process is decreased, even if the extension of the Ti silicide layer can be restrained, a low diffusion layer resistance can not be achieved.

Also, in the second conventional example, there is a problem in that although the short circuit between the gate electrode and the diffusion layer can be prevented, the short circuit between the diffusion layers cannot be restrained.

In this manner, the short circuit between the gate electrode and the diffusion layer and between the diffusion layers can not be completely restrained using the conventional methods.

SUMMARY OF THE INVENTION

The present invention solves the above problems. An object of the present invention is to provide a method of manufacturing a semiconductor device, in which a stable Ti silicide layer can be formed.

Another object of the present invention is to provide a method of manufacturing a semiconductor device, in which the formation of a short circuit between a gate electrode and a diffusion layer or between the diffusion layers can be prevented.

In order to achieve an aspect of the present invention, a method of manufacturing a semiconductor integrated circuit, includes the steps of:

forming a gate structure with sidewall insulating films and a field oxidation film on a semiconductor substrate;

forming diffusion layers for the gate structure with the sidewall insulating films;

removing a surface layer of each of the sidewall insulating films and the field oxidation film; and forming a silicide layer in a surface layer of each of the diffusion layers in self-alignment with the gate structure with the sidewall insulating films, a sheet resistance of said silicide layer being less than 10 $\Omega/\square$ and the field oxidation film.

The removing step may include removing the surface layer of each of the sidewall insulating films and the filed oxidation film by a dry etching method or a wet etching method. Also, the removing step may include removing the surface layer of each of the sidewall insulating films and the filed oxidation film with DHF solution of 1:100. Instead, the removing step may include removing the surface layer in a range of a film thickness of 5 to 60 nm from each of the sidewall insulating films and the filed oxidation film.

The formation of diffusion layers may include implanting ions which includes fluorine ions. In this case, the removing step may include removing the surface layer of each of the sidewall insulating films and the field oxidation film such that each of the sidewall insulating films and the field oxidation film has a fluorine ion surface concentration equal to or less than $1 \times 10^{20}$ atom/cm$^3$.

The step of forming the silicide layer includes forming a material layer. In this case, the material is an element selected from the group consisting of Ti, Co, Ni, Ta, W, Mo, Zr, Hf, Pt and V, or a composite alloy composed of at least two selected from the group.

The step of forming the silicide layer may include:

forming a material layer;

performing a first sintering on the material layer to convert a part of the material layer into an intermediate silicide layer;

performing a second sintering to convert the intermediate silicide layer into the silicide layer; and removing a non-silicided portion of the material layer. In this case, the step of performing a first sintering includes performing the first sintering to the material layer at a temperature equal to or lower than 700° C. Also, the step of performing a second sintering includes performing the second sintering to the intermediate silicide layer at a temperature equal to or lower than 850° C.

In order to achieve another aspect of the present invention, a method of manufacturing a semiconductor integrated circuit includes the steps of:

forming a gate structure with sidewall insulating films and a field oxidation film on a semiconductor substrate;

implanting ions including fluorine ions to form diffusion layers for the gate structure with sidewall insulating films;

reducing a fluorine ion concentration to a predetermined value in a surface of each of the sidewall insulating films and the filed oxidation film; and forming a silicide layer in a surface layer of each of the diffusion layers in self-alignment with the gate structure with the sidewall insulating films and the field oxidation film, a sheet resistance of said silicide layer being less than 10 $\Omega/\square$.

DESCRIPTION OF THE PREFERRED EMBODIMENTS

Next, a method of manufacturing a semiconductor device of the present invention will be described below in detail with reference to the attached drawings.

The cause of the extension of a Ti silicide layer is investigated to completely restrain leak current between a diffusion layer and a gate electrode and between the diffusion layers.

Figure 1A:
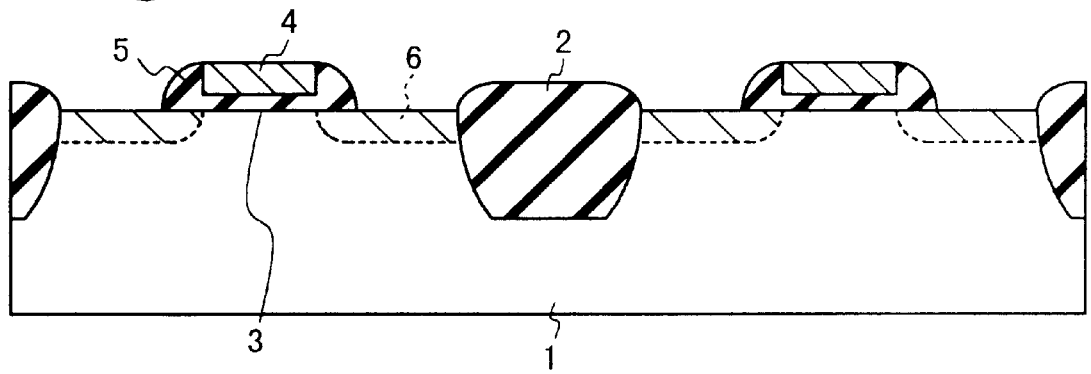
FIGS. 1A to 1G are cross sectional views illustrating a first conventional example of a method of forming a Ti silicide layer.
Figure 1B:
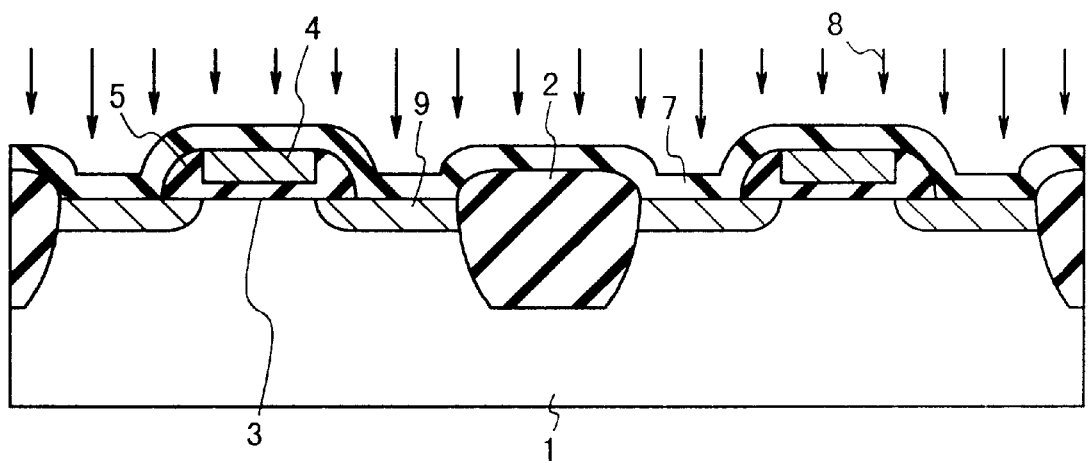
Figure 1C:
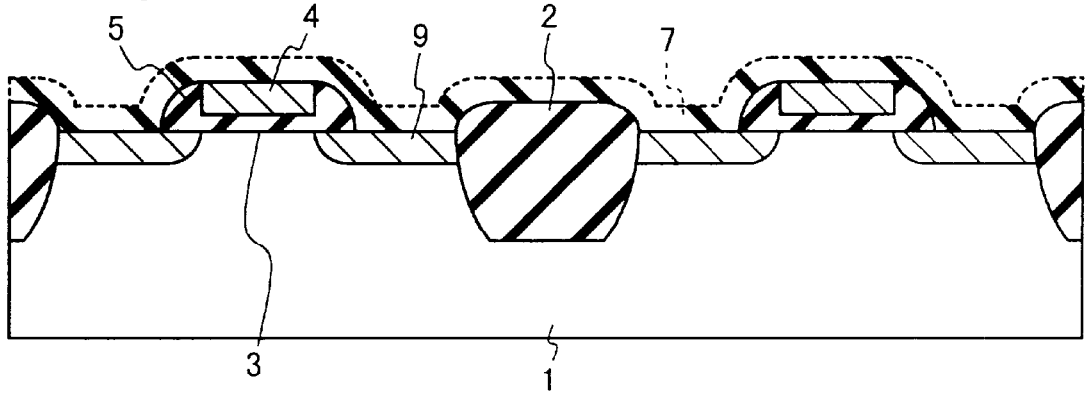
Figure 1D:
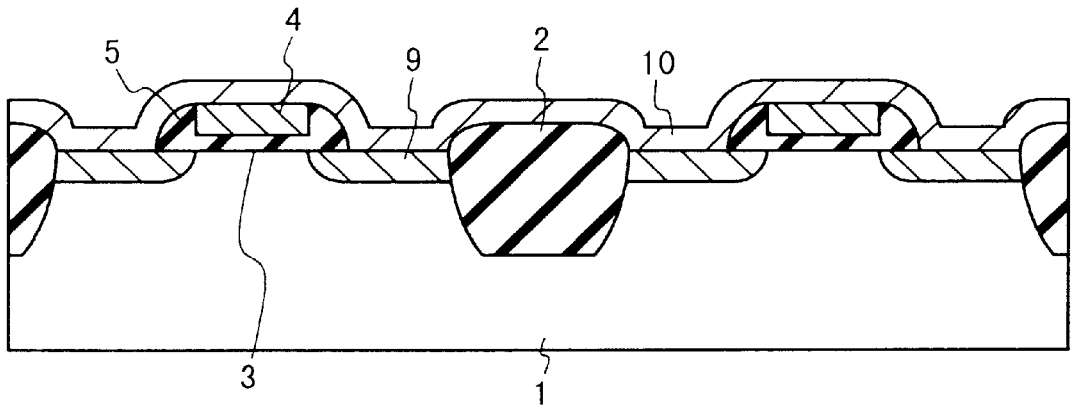
Figure 1E:
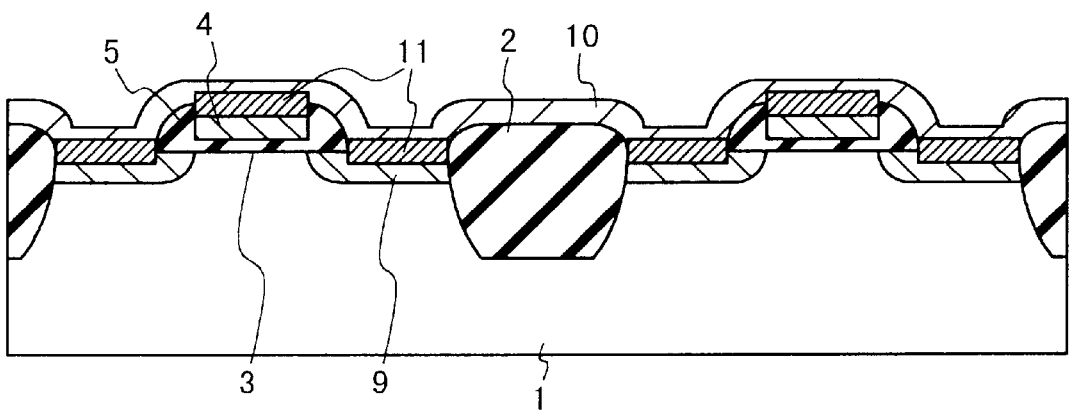
Figure 1F:
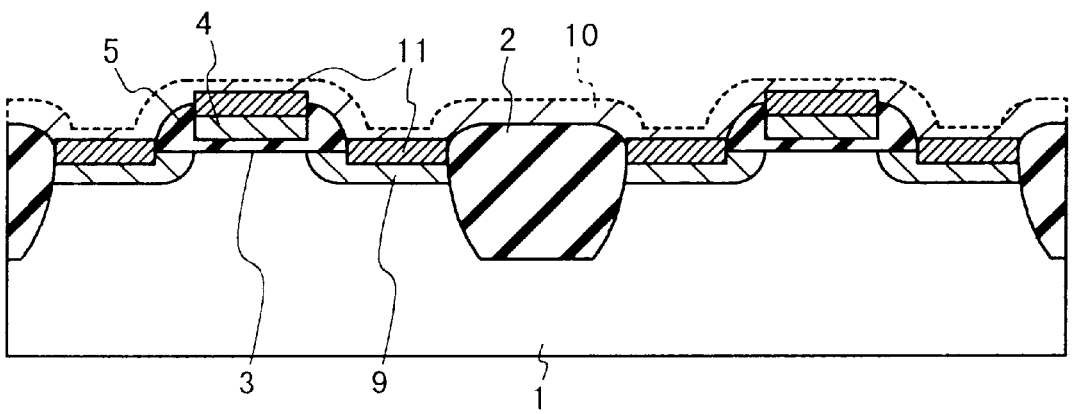
Figure 1G:
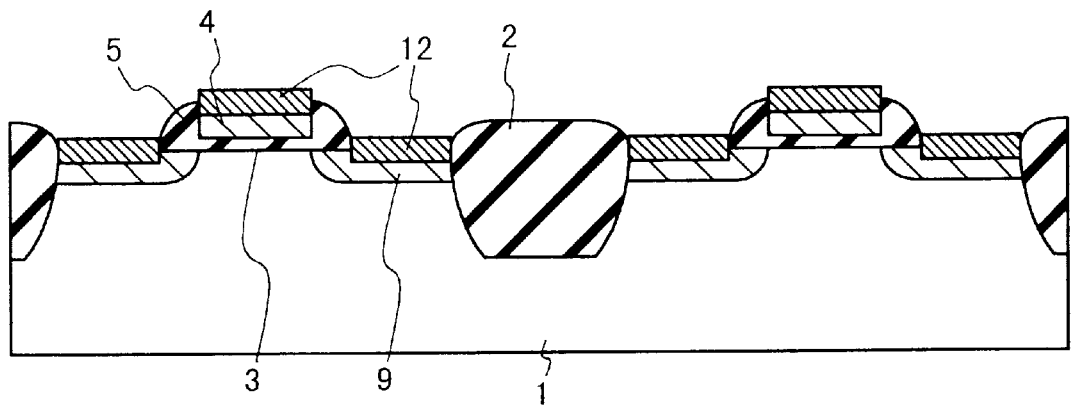
Figure 2:
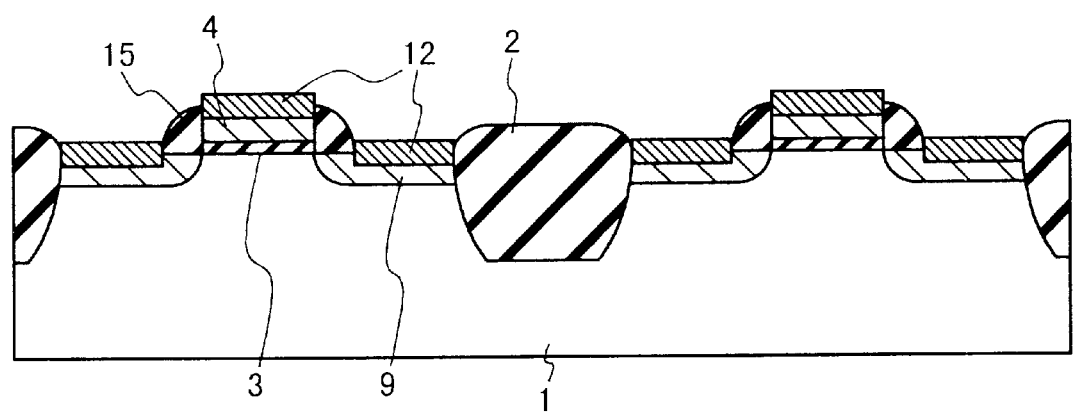
FIG. 2 is a cross sectional view illustrating a third conventional example of a method of forming a Ti silicide layer.
Figure 3A:
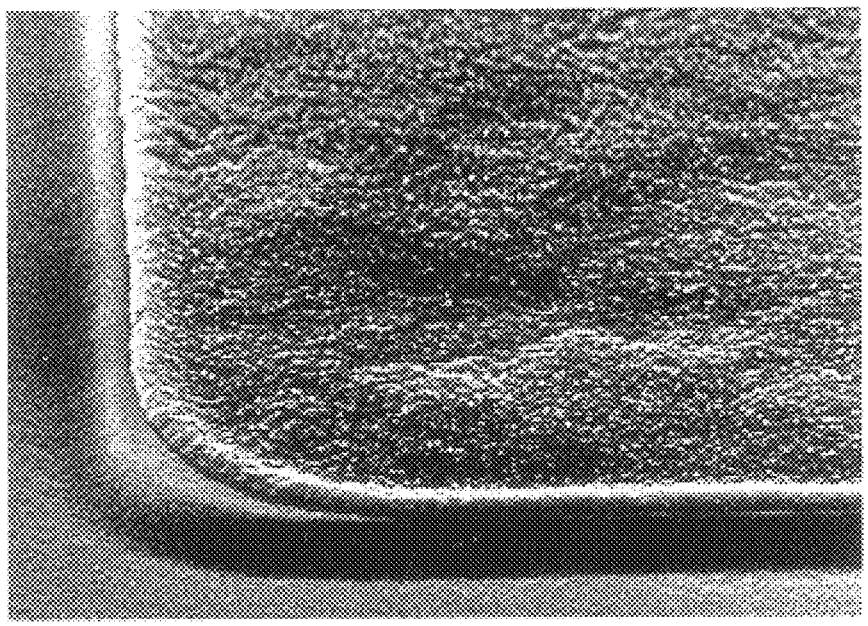
FIG. 3A is a photograph illustrating a case where extension of a Ti silicide layer is not present when $^{11}B^+$ ions are implanted.
Figure 3B:
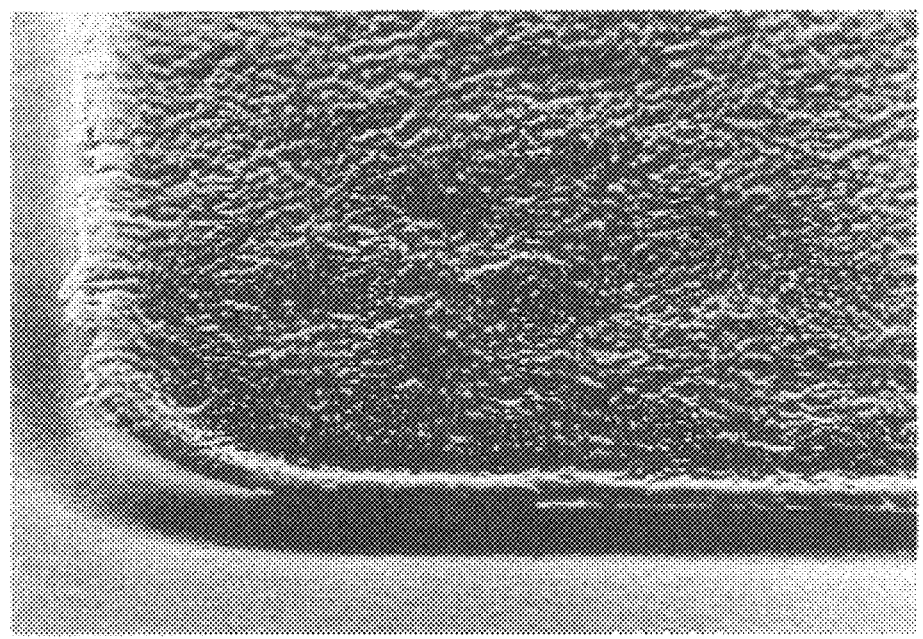
FIG. 3B is a photograph illustrating a case where extension of a Ti silicide layer is present when $^{49}BF_2^+$ ions are implanted.

Because the extension of the Ti silicide layer is large in the P-type diffusion layer, the P-type ions to be implanted are invested. FIGS. 3A and 3B show the states of the extension of the Ti silicide layer in the case where the implanting impurity ions are $^{11}B^+$ and in the case where the implanting impurity ions are $^{49}BF_2^+$. As seen from FIGS. 3A and 3B, the extension of the Ti silicide layer is seen in the case of $^{49}BF_2^+$. On the other hand, the extension of the Ti silicide layer is not seen in the case of $^{11}B^+$. From these facts, it is understood that F ions of $^{49}BF_2^+$ as P-type impurity ions to be implanted remain in a field oxide film and a sidewall film, and causes Ti silicide reaction on the field oxide film and the sidewall film to form the extension of the Ti silicide layer.

In this manner, the extension of the Ti silicide layer can be prevented if $^{11}B^+$ ions are employed as P-type impurity ions for formation of the diffusion layers. In this case, however, the shallow diffusion layer can not be formed, so that the finer processing cannot be applied in the semiconductor integrated circuit. Therefore, the present invention is made as follows.

FIGS. 4A to 4G are cross sectional views illustrating a method of manufacturing a semiconductor device according to the first embodiment of the present invention.

Figure 4A:
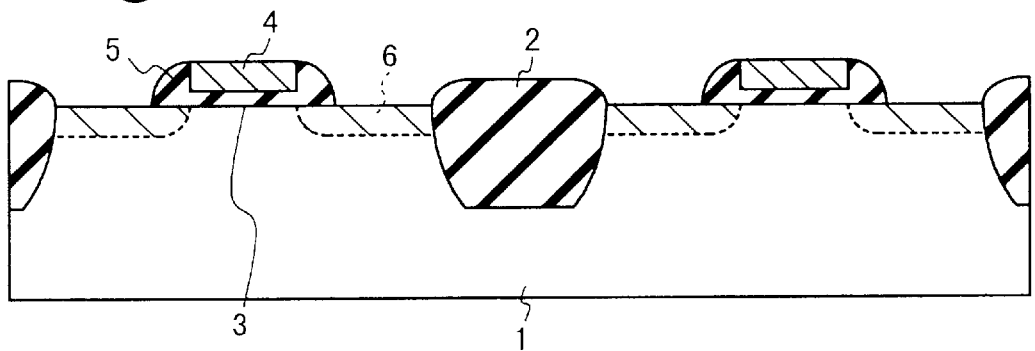
FIGS. 4A to 4G are cross sectional views illustrating a method of manufacturing a semiconductor device according to a first embodiment of the present invention in order of the process.

As shown in FIG. 4A, a field oxide film 2, a gate oxide film 3, a gate electrode 4 and a sidewall film 5 are formed in this order on a silicon substrate 1. Exposed portions 6 of the silicon substrate 1 are the areas where impurity ions will be implanted to form diffusion layers.

Figure 4B:
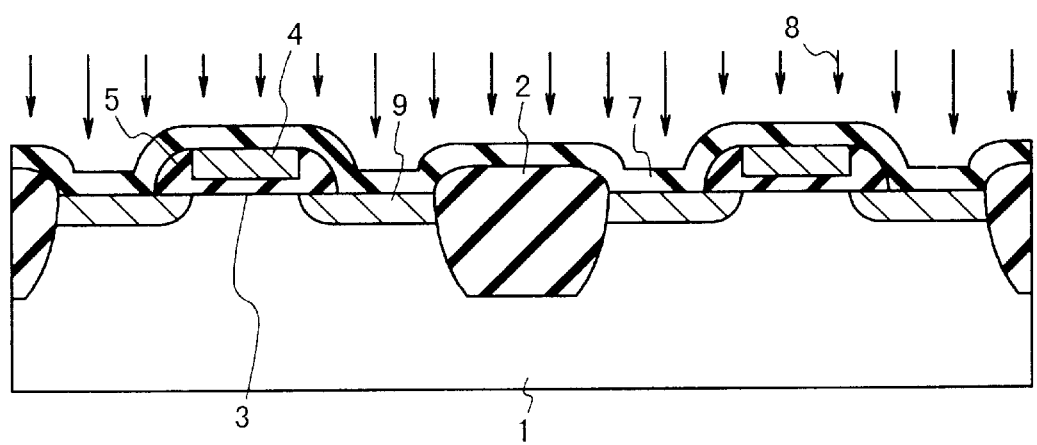
Figure 6:
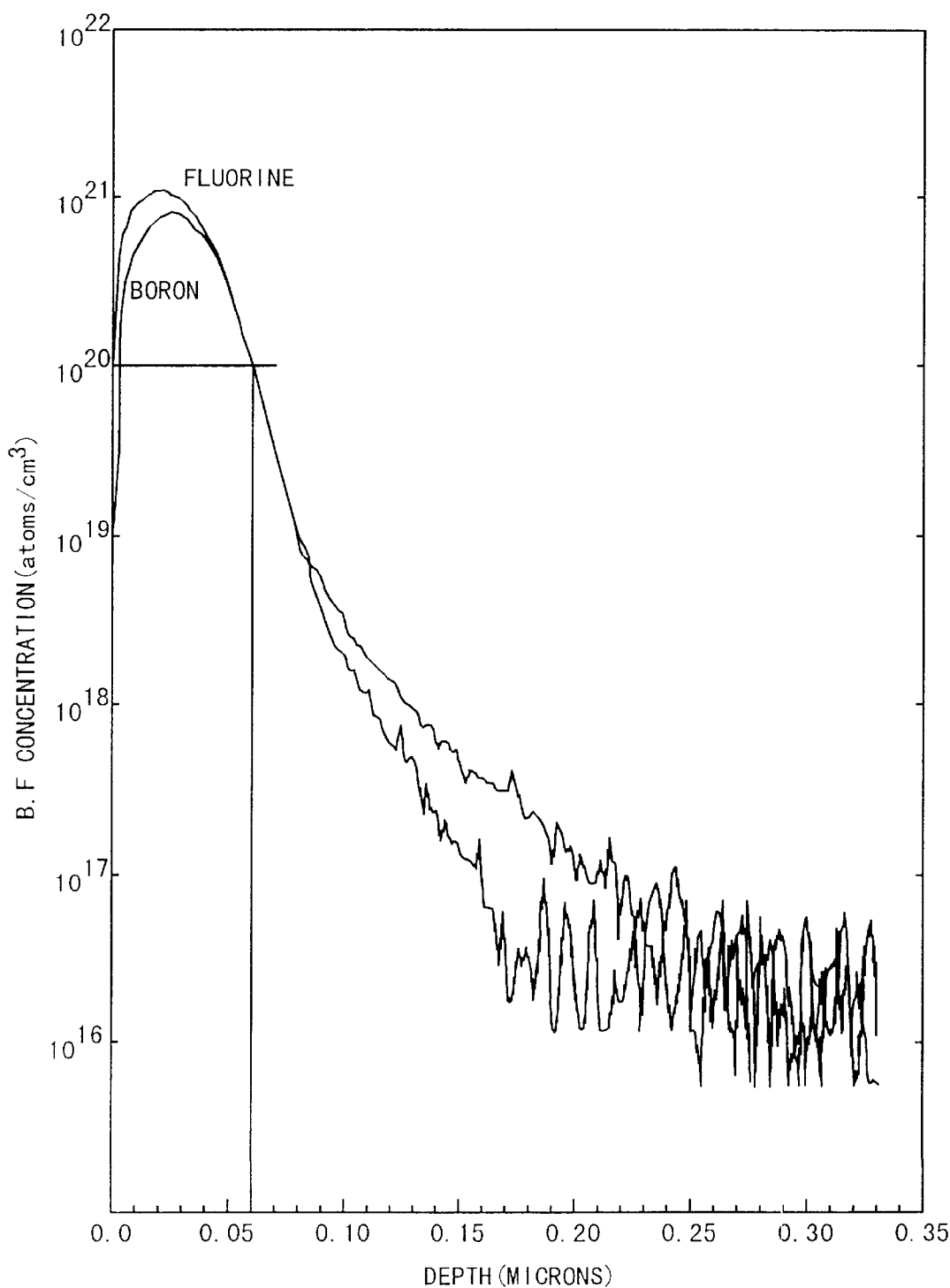
FIG. 6 is graphs illustrating depth profiles of concentrations of B and F when $^{49}BF_2^+$ ions are implanted as P-type impurity ions.

Next, as shown in FIG. 4B, a protection oxide film 7 is formed on the whole substrate by use of a CVD method for ion implantation. Then, impurity ions 8 are implanted into the whole surface of the substrate 1 to form diffusion layers 9. In this case, P-type diffusion layers are formed. $^{49}BF_2^+$ ions are used as the P-type impurity ions to form a shallow junction and are implanted on the whole surface of the substrate 1 using an acceleration voltage of 30 KeV and to dose amount of $3 \times 10^{15}$ cm$^{-2}$. At this time, a depth profile of the concentration of ions B and F to be implanted is determined based on the acceleration energy. As shown in FIG. 6, the maximum concentration appears at the depth position of about 30 nm in case of B, and at the depth position of about 25 nm in case of F.

Figure 4C:
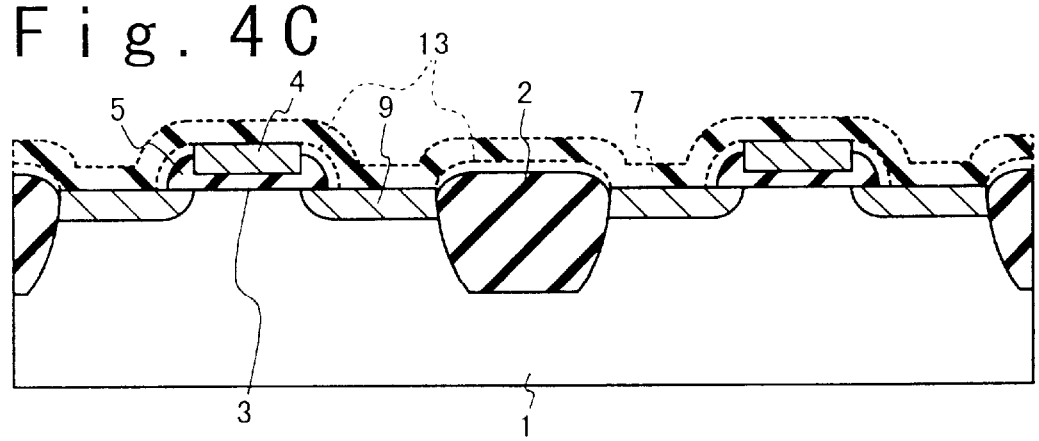

Next, heat treatment is performed by a lamp annealing apparatus for 10 seconds at a temperature of 1000° C. to activate the impurity ions. After that, the protection oxide film 7 is removed by an RIE etching apparatus. Further, a natural oxide film is removed from the diffusion layers 9 and the gate electrode 4 with a DHF (diluted hydrogen fluoride) solution of 1:100 before sputtering of Ti, as shown in FIG. 4C. In this case, the surface layers 13 of the field oxide film 2 and sidewall films 5 are simultaneously removed such that the fluorine concentration becomes equal to or less than $1 \times 10^{20}$ atom/cm$^3$ in the surface layers of the field oxide film 2 and sidewall films 5.

Figure 4D:
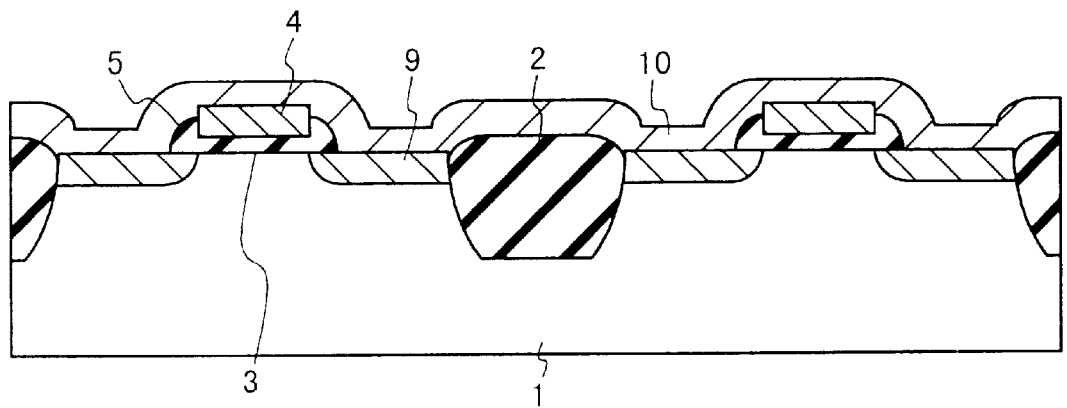
Figure 4E:
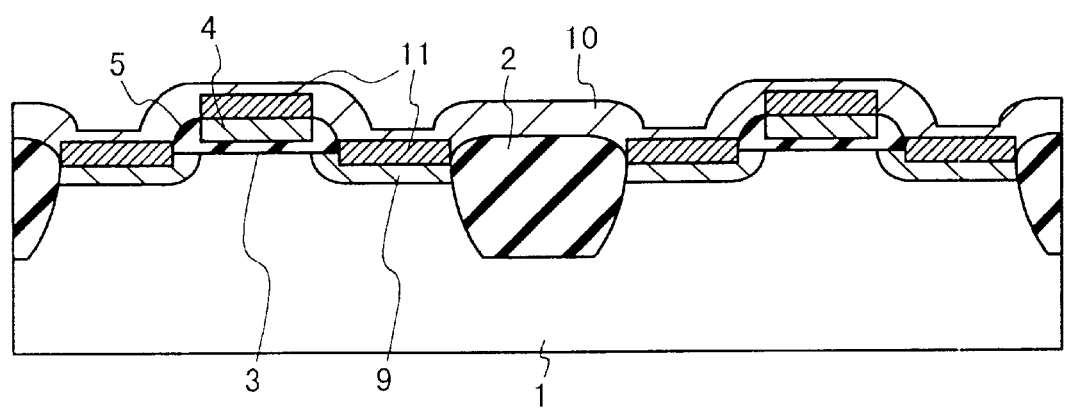

Next, as shown in FIG. 4D, a Ti film 10 is formed on the whole surface of the substrate 1 through sputtering to a film thickness of 30 nm. Heat treatment (the first sintering process) is performed to the Ti film 10 at a temperature of 700° C. for 30 seconds using the lamp annealing apparatus such that a Ti silicide layer 11 of the C49 phase is formed which is high resistance TiSi$_2$, as shown in FIG. 4E. In this case, the Ti silicide layer 11 is formed only on the gate electrode 3 and the diffusion layers 9 in a self-alignment manner.

Figure 4F:
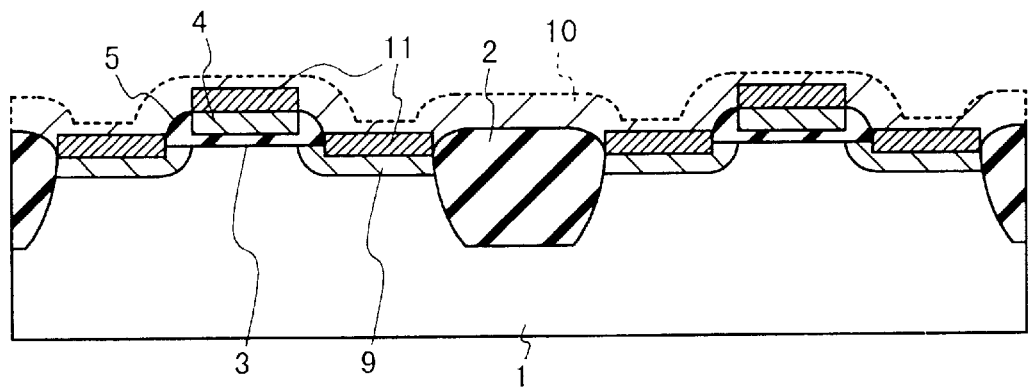
Figure 4G:
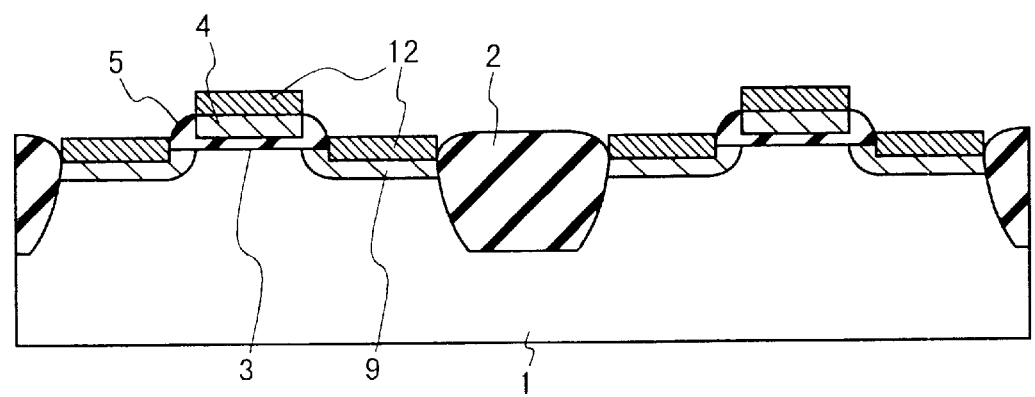

Subsequently, an un-reacted portion of the Ti films 10 on the field oxide film 2 and the side wall films 5 are removed with an ammonium hydroxide peroxide mixture (APM), as shown in FIG. 4F. Further, heat treatment (the second sintering process) is performed at a temperature of 850° C. for 10 seconds using the lamp annealing apparatus. As a result, as shown in FIG. 4G, a Ti silicide layer 12 of the C54 phase is formed which is low resistance TiSi$_2$.

Figure 7:
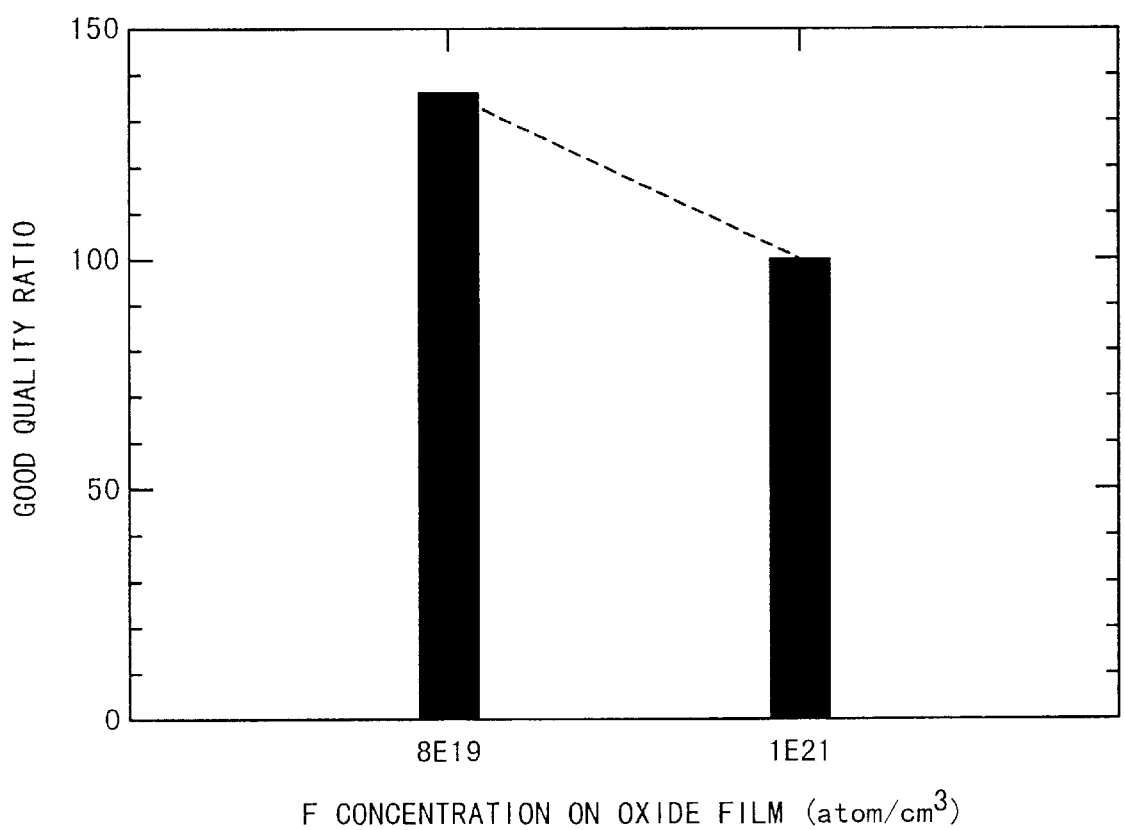
FIG. 7 is a diagram illustrating the ratio of products with good quality when the semiconductor devices are manufactured in accordance with the first embodiment of the present invention.

In the present invention, extension of the Ti silicide layer onto the field oxide film 2 and the sidewall films 5 is not seen. Also, the sheet resistance of the Ti silicide layer becomes lower than 10 Ω/□, so that the improvement of element operation speed can be realized. As a result, the of products with good quality increases as shown in FIG. 7.

FIGS. 5A to 5I are cross sectional views illustrating a method of manufacturing a semiconductor device according to the second embodiment of the present invention.

Figure 5A:
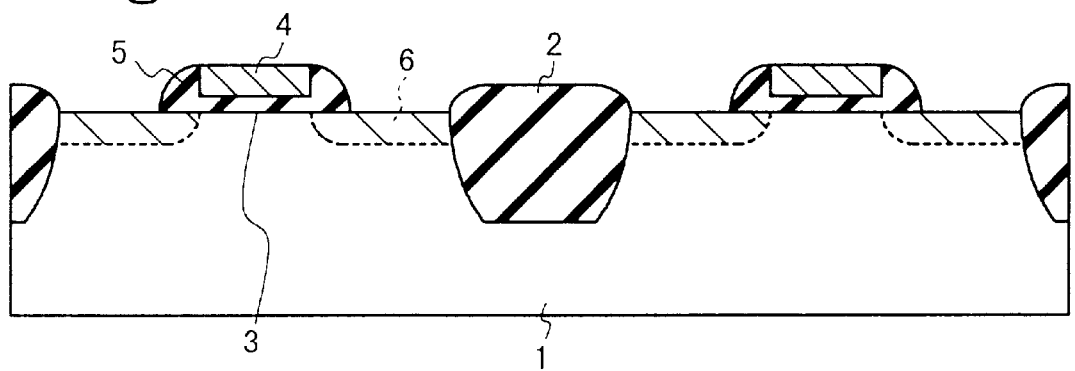
FIGS. 5A to 5I are cross sectional views illustrating a method of manufacturing a semiconductor device according to a second embodiment of the present invention in order of the process.

As shown in FIG. 5A, a field oxide film 2, a gate oxide film 3, a gate electrode 4 and a sidewall film 5 are formed in this order on a silicon substrate 1, as in the first embodiment. Exposed portions 6 of the silicon substrate 1 are the areas where impurity ions will be implanted to form diffusion layers.

Figure 5B:
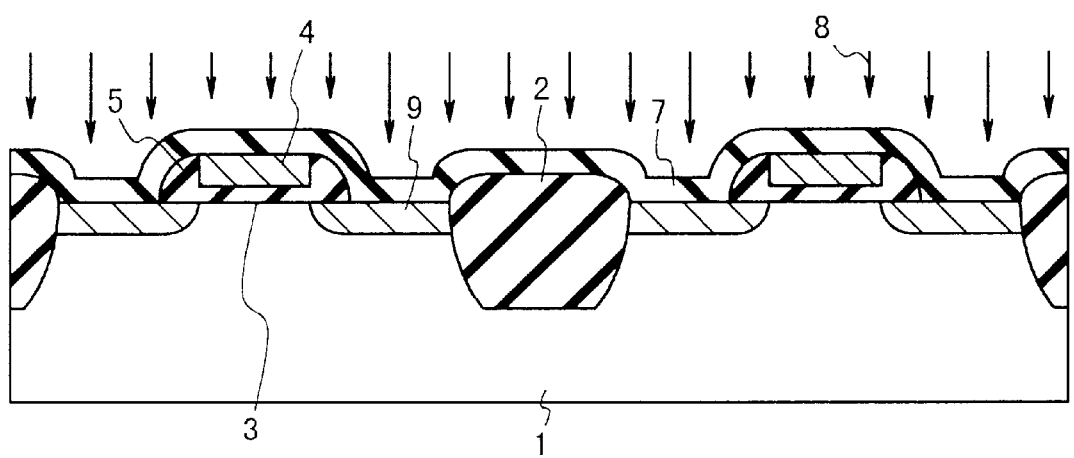

Next, as shown in FIG. 5B, a protection oxide film 7 is formed on the whole surface of the substrate 1 by use of a CVD method for ion implantation. Then, impurity ions 8 are implanted into the whole surface of the substrate 1 to form diffusion layers 9. In this case, P-type diffusion layers are formed, as in the first embodiment. $^{49}BF_2^+$ ions are used as the P-type impurity ions to form a shallow junction and are implanted on the whole surface of the substrate 1 with an acceleration voltage of 30 KeV and a dose amount of $3 \times 10^{15}$ cm$^{-2}$. At this time, a depth profile of concentration of ions B and F to be implanted is determined based on the acceleration energy. As shown in FIG. 6, the maximum concentration appears at the depth position of about 30 nm in case of B, and at the depth position of about 25 nm in case of F.

Next, heat treatment is performed using a lamp annealing apparatus for 10 seconds at a temperature of 1000° C. to activate the impurity ions.

Figure 5C:
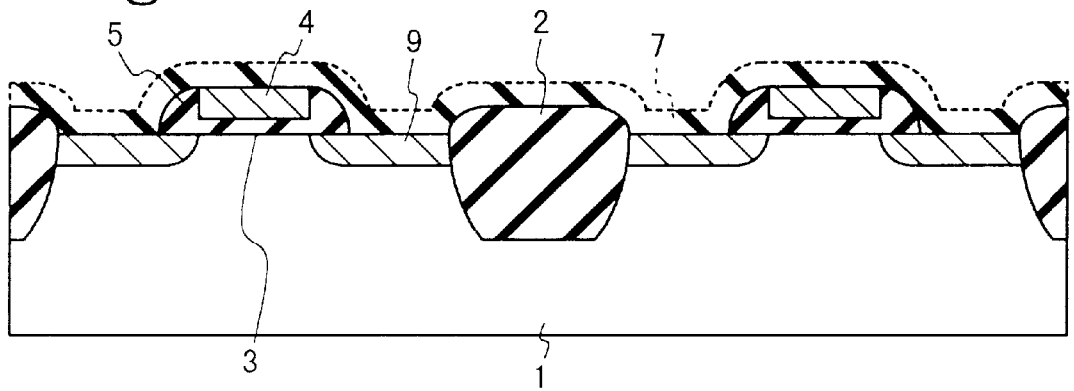
Figure 5D:
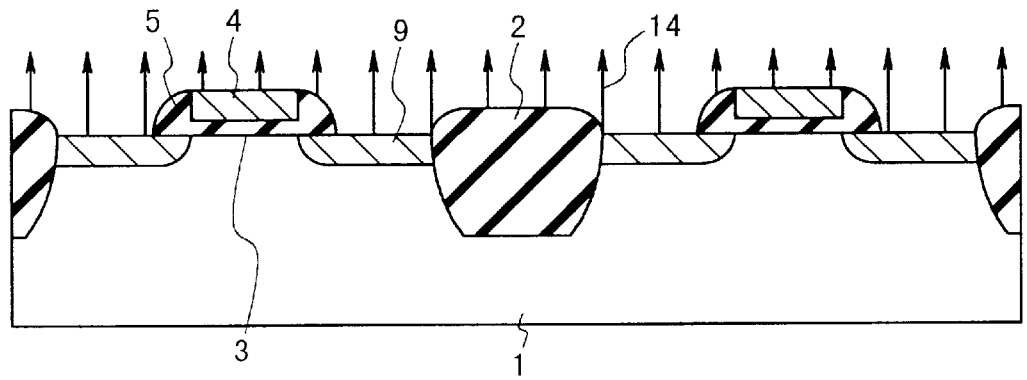

After that, as shown in FIG. 5C, the protection oxide film 7 is removed by an RIE etching apparatus. Then, heat treatment is performed at a temperature of 1000° C. for 10 seconds using a lamp annealing apparatus to activate the impurity ions. At this time, as shown in FIG. 5D, fluorine gas is emitted as an out gas from the surface layer of each of the field oxide film 2 and the sidewall films 5.

Figure 5E:
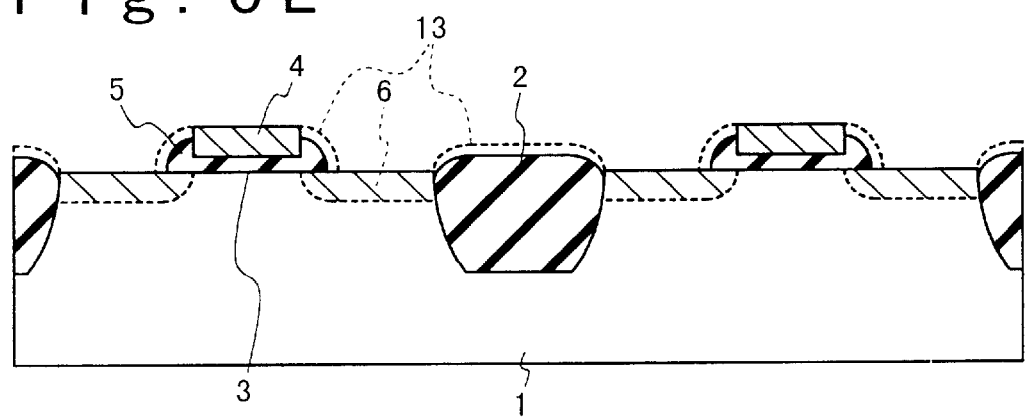

Subsequently, a natural oxide film is removed from the diffusion layers 9 and the gate electrode 4 with a DHF solution of 1:100 before the sputtering of Ti, as shown in FIG. 5E. In this case, the surface layers of the field oxide film 2 and sidewall films 5 are simultaneously removed in a range of the film thickness of 5 to 60 nm. When the surface layers of the field oxide film 2 and sidewall films 5 are removed resulting in a film thickness below 5 nm or above 60 nm, the surface in which fluorine concentration is high is exposed to form the extension of the Ti silicide layer on the field oxide film 2 or the sidewall films 5. It is easy to control the etching amount to be in the range of 5 to 60 nm because it is sufficient that the etching time period is controlled.

Figure 5F:
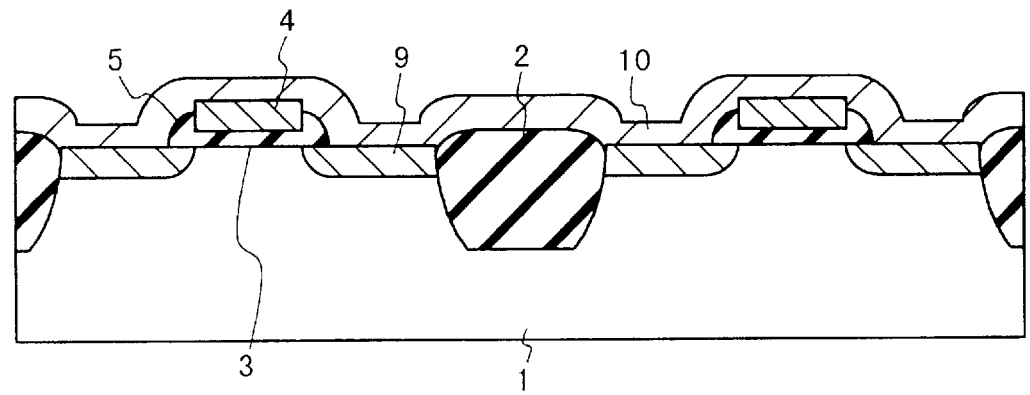
Figure 5G:
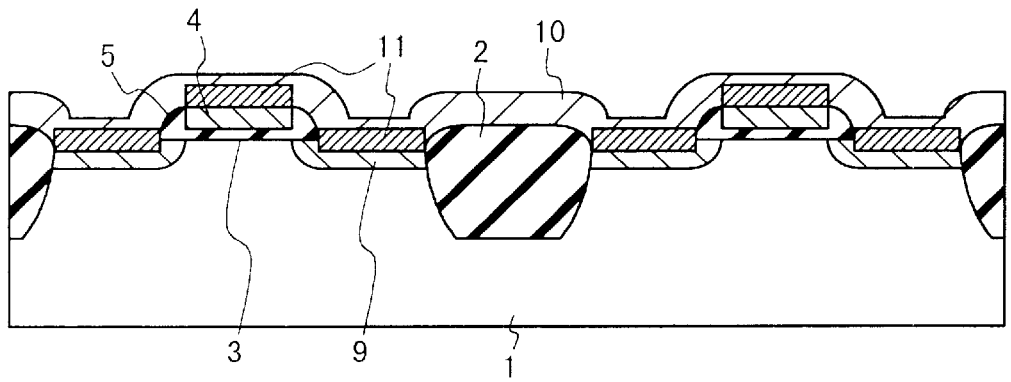

Next, as shown in FIG. 5F, a Ti film 10 is formed on the whole surface of the substrate 1 through a sputtering process to have a film thickness of 30 nm. Heat treatment (the first sintering process) is performed to the Ti film 10 at a temperature of 700° C. for 30 seconds using the lamp annealing apparatus such that a Ti silicide layer 11 of the C49 phase is formed which is high resistance TiSi$_2$ of, as shown in FIG. 5G. In this case, the Ti silicide layer 11 is formed only on the gate electrode 3 and the diffusion layers 9 in a self-alignment manner.

Figure 5H:
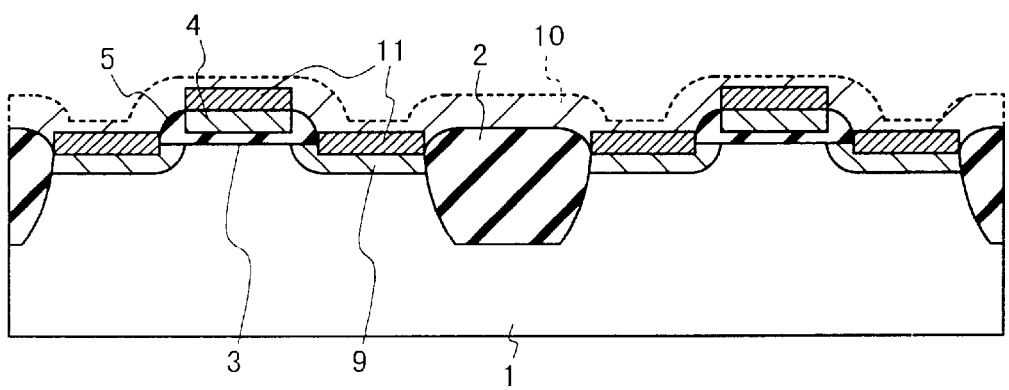
Figure 5I:
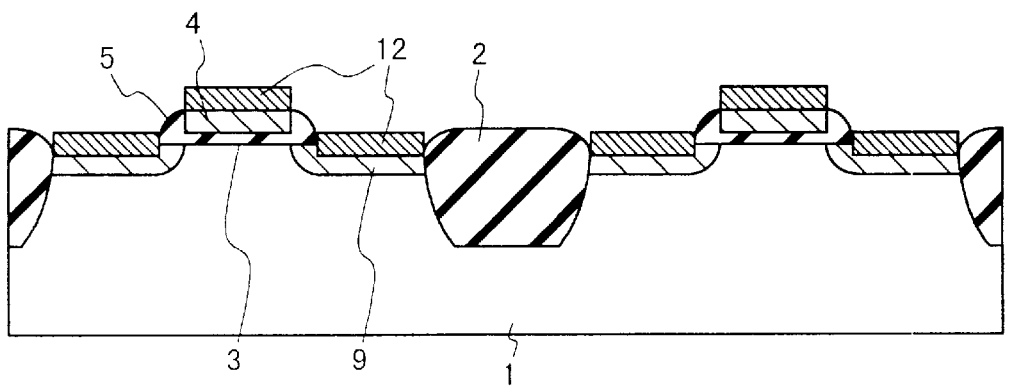

Subsequently, an un-reacted portion of the Ti films 10 on the field oxide film 2 and the side wall films 5 are removed with an ammonium hydroxide peroxide mixture (APM), as shown in FIG. 5H. Further, heat treatment (the second sintering process) is performed at a temperature of 850° C. for 10 seconds using the lamp annealing apparatus. As a result, as shown in FIG. 5I, a Ti silicide layer 12 of the C54 phase is formed which is low resistance TiSi$_2$.

In the present invention, extension of the Ti silicide layer onto the field oxide film 2 and the sidewall films 5 is not seen. Also, the sheet resistance of the Ti silicide layer becomes lower than 10Ω/□, so that the improvement of element operation speed can be realized. As a result, the ratio of products with good quality increases as shown to FIG. 7.

The silicide film using Ti was explained above. However, a refractory metal selected from the group consisting of Ti, Co, Ni, Ta, W, Mo, Zr, Hf, Pt, and V, or a composition alloy of at least two elements selected from the group may be used.

As described above, according to the present invention, the process of removing fluorine ions which have implanted into the field oxide film and sidewall films is introduced before forming the Ti silicide layer. The reason why fluorine ions are removed is that the fluorine ions which have implanted into the field oxide film and the sidewall films in the formation of the P-type diffusion layers cause the extension of the Ti silicide layer on the field oxide film and the sidewall films in the first sintering process. This extension generates short circuits between the gate electrode and the diffusion layer and between the diffusion layers. Therefore, the fluorine ions are removed to restrain the formation of the extension of the Ti silicide layer.

As a method of removing fluorine, a field oxide film and the sidewall films may be etched with a dry etching or a wet etching. Alternatively, fluorine is emitted through heat treatment in case of the activation of impurity ions. Instead, the heat treatment may be employed independently of the activation.

By this method, a semiconductor device with good quality can be obtained without the extension of the Ti silicide layer and with stable characteristic.

What is claimed is:

1. A method of manufacturing a semiconductor integrated circuit, comprising the steps of:
    forming a gate structure with sidewall insulating films and a field oxidation film on a semiconductor substrate;
    forming diffusion layers for said gate structure with said sidewall insulating films;
    removing a surface layer of each of said sidewall insulating films and said field oxidation film; and
    forming a silicide layer in a surface layer of each of said diffusion layers in self-alignment with said gate structure with said sidewall insulating films and said field oxidation film, a sheet resistance of said silicide layer being less than 10 $\Omega/\square$.

2. A method according to claim 1, wherein said removing step includes removing said surface layer of each of said sidewall insulating films and said field oxidation film by a dry etching method or a wet etching method.

3. A method according to claim 1, wherein said removing step includes removing said surface layer of each of said sidewall insulating films and said field oxidation film with DHF solution of 1:100.

4. A method according to claim 1, wherein said removing step includes removing said surface layer in a range of a film thickness of 5 to 60 nm from each of said sidewall insulating films and said field oxidation film.

5. A method according to claim 1, wherein said step of forming diffusion layers includes implanting ions, said implanted ions including fluorine ions, and
    wherein said removing step includes removing said surface layer of each of said sidewall insulating films and said field oxidation film such that each of said sidewall insulating films and said field oxidation film has a fluorine ion surface concentration equal to or less than $1\times10^{20}$ atom/cm$^3$.

6. A method according to claim 1, wherein said step of forming said silicide layer includes forming a material layer, and
    wherein said material is an element selected from a group consisting of Ti, Co, Ni, Ta, W, Mo, Zr, Hf, Pt and V, or a composite alloy composed of at least two elements selected from said group.

7. A method according to claim 1, wherein said step of forming said silicide layer includes:
    forming a material layer;
    performing a first sintering on said material layer to convert a part of said material layer into an intermediate silicide layer;
    performing a second sintering to convert said intermediate silicide layer into said silicide layer; and
    removing a non-silicided portion of said material layer.

8. A method according to claim 7, wherein said step of performing a first sintering includes performing said first sintering to said material layer at a temperature equal to or lower than 700° C., and
    wherein said step of performing a second sintering includes performing said second sintering to said intermediate silicide layer at a temperature equal to or lower than 850° C.

9. A method of manufacturing a semiconductor integrated circuit, comprising the steps of:
    forming a gate structure with sidewall insulating films and a field oxidation film on a semiconductor substrate;
    implanting ions, said ions including fluorine ions, to form diffusion layers for said gate structure with sidewall insulating films;
    reducing a fluorine ion concentration to a predetermined value in a surface of each of said sidewall insulating films and said field oxidation film; and
    forming a silicide layer in a surface layer of each of said diffusion layers in self-alignment with said gate structure with said sidewall insulating films and said field oxidation film, a sheet resistance of said silicide layer being less than 10 $\Omega/\square$.

10. A method according to claim 9, wherein said reducing step includes removing a surface layer of each of said sidewall insulating films and said field oxidation film by a dry etching method or a wet etching method.

11. A method according to claim 9, wherein said reducing step includes removing a surface layer of each of said sidewall insulating films and said field oxidation film with DHF solution of 1:100.

12. A method according to claim 9, wherein said reducing step includes removing a surface layer in a range of a film thickness of 5 to 60 nm from each of said sidewall insulating films and said field oxidation film.

13. A method according to claim 9, wherein said reducing step includes reducing said fluorine ion concentration to the predetermined value equal to or less than $1\times10^{20}$ atom/cm$^3$ in a surface of each of said sidewall insulating films and said field oxidation film.

14. A method according to claim 9, wherein said reducing step includes heating said semiconductor substrate such that the fluorine ions are emitted from said surface of each of said sidewall insulating films and said field oxidation film.

15. A method according to claim 14, wherein said heating step includes activating said implanted ions.

16. A method according to claim 9, wherein said step of forming said silicide layer includes forming a material layer, and
    wherein said material is an element selected from a group consisting of Ti, Co, Ni, Ta, W, Mo, Zr, Hf, Pt and V, or a composite alloy composed of at least two elements selected from said group.

17. A method according to claim 9, wherein said step of forming said silicide layer includes:

forming a material layer;

performing a first sintering on said material layer to convert a part of said material layer into an intermediate silicide layer;

performing a second sintering to convert said intermediate silicide layer into said silicide layer; and removing a non-silicided portion of said material layer.

18. A method according to claim 17, wherein said step of performing a first sintering includes performing said first sintering to said material layer at a temperature equal to or lower than 700° C., and wherein said step of performing a second sintering includes performing said second sintering to said intermediate silicide layer at a temperature equal to or lower than 850° C.

* * * * *